(12) United States Patent
Daibo et al.

(10) Patent No.: US 10,049,800 B2
(45) Date of Patent: Aug. 14, 2018

(54) HIGH-TEMPERATURE SUPERCONDUCTING COIL AND SUPERCONDUCTING DEVICE

(71) Applicant: FUJIKURA LTD., Tokyo (JP)

(72) Inventors: Masanori Daibo, Sakura (JP); Hiroshi Chiba, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/769,356

(22) PCT Filed: Feb. 21, 2014

(86) PCT No.: PCT/JP2014/054184
§ 371 (c)(1),
(2) Date: Aug. 20, 2015

(87) PCT Pub. No.: WO2014/129586
PCT Pub. Date: Aug. 28, 2014

(65) Prior Publication Data
US 2016/0005518 A1    Jan. 7, 2016

(30) Foreign Application Priority Data
Feb. 25, 2013   (JP) .................................. 2013-035208

(51) Int. Cl.
*H01F 6/06* (2006.01)
*H01L 39/14* (2006.01)

(52) U.S. Cl.
CPC ............. *H01F 6/06* (2013.01); *H01L 39/143* (2013.01)

(58) Field of Classification Search
None
See application file for complete search history.

(56) References Cited

U.S. PATENT DOCUMENTS 3,869,686 A * 3/1975 Benz .................. H01F 6/06
174/15.4
5,384,197 A * 1/1995 Koyama ............. H01F 6/06
174/125.1

(Continued)

FOREIGN PATENT DOCUMENTS

EP    2 801 983 A1    11/2014
JP    9-63881 A    3/1997

(Continued)

OTHER PUBLICATIONS

Communication dated Nov. 4, 2016, from the European Patent Office in counterpart European Application No. 14753760.9.

*Primary Examiner* — Colleen P Dunn
(74) *Attorney, Agent, or Firm* — Sughrue Mion, PLLC

(57) ABSTRACT

A high-temperature superconducting coil according to the invention includes an oxide superconducting wire including a tape-shaped substrate, an intermediate layer being stacked on the substrate, an oxide superconducting layer being stacked on the intermediate layer, and a metal stabilized layer being stacked on the oxide superconducting layer; a coil main body being formed by winding the oxide superconducting wire in a coil shape; and an impregnated resin layer being formed of an impregnated resin of which a thermal shrinkage rate indicating a rate of change of a length when cooling is performed from 293 K to 140 K is greater than or equal to −0.517%, the impregnated resin layer covering the coil main body.

4 Claims, 4 Drawing Sheets

(56) References Cited

U.S. PATENT DOCUMENTS

| | | | | |
|---|---|---|---|---|
| 5,538,942 A | * | 7/1996 | Koyama | H01F 6/06 174/125.1 |
| 5,606,300 A | * | 2/1997 | Koyama | H01F 6/06 323/360 |
| 6,657,526 B2 | * | 12/2003 | Nagashima | H01L 39/143 257/E39.018 |
| 6,870,452 B2 | * | 3/2005 | Tomita | H01L 39/2474 335/216 |
| 9,183,970 B2 | * | 11/2015 | Maeda | H01L 39/247 |
| 2002/0132738 A1 | * | 9/2002 | Nagashima | H01L 39/143 505/100 |
| 2002/0190824 A1 | * | 12/2002 | Tomita | H01L 39/2474 335/216 |
| 2009/0078150 A1 | * | 3/2009 | Hasegawa | B60L 13/04 104/286 |
| 2012/0122697 A1 | * | 5/2012 | Miyazaki | H01F 6/06 505/211 |
| 2014/0066314 A1 | * | 3/2014 | Maeda | H01L 39/247 505/230 |

FOREIGN PATENT DOCUMENTS

| | | |
|---|---|---|
| JP | 11-260625 A | 9/1999 |
| JP | 2001-257113 A | 9/2001 |
| JP | 2005-322831 A | 11/2005 |
| JP | 2010-93036 | 4/2010 |
| JP | 2010-267835 A | 11/2010 |
| JP | 2011-198469 A | 10/2011 |
| JP | 2012-216504 A | 11/2012 |
| JP | 2013-247281 A | 12/2013 |
| WO | 2013/129568 A1 | 9/2013 |

* cited by examiner

HIGH-TEMPERATURE SUPERCONDUCTING COIL AND SUPERCONDUCTING DEVICE

CROSS REFERENCE TO RELATED APPLICATIONS

This application is a National Stage of International Application No. PCT/JP2014/054184 filed Feb. 21, 2014, claiming priority based on Japanese Patent Application No. 2013-035208 filed Feb. 25, 2013, the contents of all of which are incorporated herein by reference in their entirety.

TECHNICAL FIELD

The present invention relates to a high-temperature superconducting coil and a superconducting device.

BACKGROUND ART

A superconducting wire based on metal such as NbTi used in the related art is provided in the form of round wire or rectangular wire, and the degree of freedom in shape is high. On the contrary, in an oxide superconductor which is based on bismuth (Bi) or yttrium (Y), or the like and of which the critical temperature is in a range of about 90 K to 100 K, an oxide superconducting layer is formed of ceramic, and the structure thereof has a tape shape of which the aspect ratio is great.

The oxide superconducting layer is a kind of ceramic, and the rare earth oxide-based superconducting wire which has been known to be based on Y has a structure in which a plurality of thin films are stacked on a metal substrate provided as a tension member. For example, the rare earth oxide-based oxide superconducting wire employs a structure in which an oxide superconducting layer is stacked on heat resistant tape-shaped metal substrate such as hastelloy (manufactured by Haynes International, Inc., product name) or the like via an intermediate layer in which the crystal orientation is controlled, and a stabilized layer formed of the metal material such as Cu is stacked on the oxide superconducting layer.

With respect to the superconducting coil obtained by using the rare earth oxide-based superconducting wire, recently, it has been indicated that peeling stress acts in the thickness direction of the superconducting wire when being cooled due to the linear expansion coefficient difference or the shrinkage rate difference (since linear expansion coefficient becomes non-linear in low temperature, ratio of lengths in room temperature and low temperature is indicated by percentage) between the impregnated resin and copper or hastelloy (manufactured by Haynes International, Inc., product name) that configures a superconducting wire, when the coil is formed, such that the superconducting characteristic may be deteriorated after the formation of the coil.

Recently, as a measure for decreasing the peeling stress described above, coil structures disclosed in PTL 1 or 2 described below have been suggested.

The structure disclosed PTL 1 is a structure in which an insulating layer is coated on the whole circumferential surface of the superconducting wire and a mold releasing material layer is formed only on a portion of the outer surface of the insulating layer as a measure for decreasing peeling stress to the rare earth oxide-based superconducting wire, and particularly, a technique in which the mold releasing material layer is applied only to a portion in which the stress is strong in the radial direction of the superconducting coil is also disclosed.

In PTL 1, a composite superconducting wire in which the whole circumference of an oxide superconducting wire formed of a flat material is coated with an insulating material layer so as to be provided along a mold releasing material layer on one surface side thereof is disclosed. In addition, a superconducting coil having a structure in which the composite superconducting wire is subjected to coil processing, and is hardened by a curable resin layer that is cured by impregnating a thermosetting synthetic resin such as an epoxy resin.

Subsequently, in the technique disclosed in PTL 2, a structure in which a superconducting coil portion obtained by winding a thin film superconducting wire having a multilayered structure on the external circumference of an annular winding core in a concentric circular shape is included and mold releasing portions are provided on respective boundary portions of an inner portion, an intermediate portion, and an outer portion of the superconducting coil portion so that the stress can be released is suggested.

According to the structure disclosed in PTL 2, a structure in which the bonding strength of the superconducting coil portion in the radial direction is weaker than that of the other portions is partially introduced, the stress can be released in a portion in which the bonding strength is weak, and thus the decrease of the peeling stress on the superconducting wire itself is attempted.

PRIOR ART DOCUMENTS

Patent Documents
[PTL 1] Japanese Unexamined Patent Application, First Publication No. 2011-198469
[PTL 2] Japanese Unexamined Patent Application, First Publication No. 2010-267835

SUMMARY OF THE INVENTION

Problems to be Solved by the Invention

Since the oxide superconducting coil is used in a temperature lower than the critical temperature of the oxide superconducting wire, an operation of cooling the oxide superconducting coil from room temperature to an operation temperature less than or equal to the critical temperature is performed necessarily. It is considered that a stress releasing treatment can be performed to a certain degree by employing the structures disclosed in PTLs 1 and 2 above.

However, if an action of thermal stress in the superconducting coil is considered, it is considered that the thermal stress is not even in the radial direction of the coil, the stress unevenly acts, for example, the stress more remarkably acts in the intermediate side of the coil, and the stress becomes different according to the size of the dimension of the coil such that it is a concern that the stress in an amount in which the oxide superconducting wire cannot endure may affect a coil having a large diameter.

The structures disclosed in PTLs 1 and 2 above are methods of decreasing the peeling stress that affects the superconducting wire by performing the mold releasing treatment on each portion of the cross section of the superconducting coil or each superconducting wire, to reduce the thermal stress. However, due to the structure in which a mold releasing layer is formed on a portion or substantially the whole turn of the inner side of the superconducting coil, if the peeling of the bonding layer between the impregnated resin and the mold releasing layer in the superconducting coil proceeds by the electromagnetic force at the time of energizing the superconducting coil or repeated energization, there is a concern that the strength of the superconducting coil gradually decreases. Therefore, a structure in which the superconducting coil is not deteriorated even by the electromagnetic force at the time of energization or repeated energization is preferably employed.

The invention is conceived in view of the circumstances described above, and an object of the invention is to provide a high-temperature superconducting coil in which peeling of the oxide superconducting layer does not easily occur and the superconducting characteristics are not easily deteriorated by the thermal stress that has an effect when being cooled to a temperature less than or equal to a critical temperature of the oxide superconducting wire to be used, and a superconducting device including the high-temperature superconducting coil.

Means for Solving the Problems

In order to solve the problems described above, according to a first aspect of the invention, there is provided a high-temperature superconducting coil including: an oxide superconducting wire including a tape-shaped substrate, an intermediate layer being stacked on the substrate, an oxide superconducting layer being stacked on the intermediate layer, and a metal stabilized layer being stacked on the oxide superconducting layer; a coil main body being formed by winding the oxide superconducting wire in a coil shape; and an impregnated resin layer being formed of an impregnated resin of which a thermal shrinkage rate indicating a rate of change of a length when cooling is performed from 293 K to 140 K is greater than or equal to −0.517%, the impregnated resin layer covering the coil main body.

Since the impregnated resin layer is formed of an impregnated resin of which a thermal shrinkage rate at 140 K with respect to 293 K is greater than or equal to −0.517%, it is possible to provide a high-temperature superconducting coil of which there is less concern that the oxide superconducting layer may be peeled and the superconducting characteristics are not easily deteriorated even if the thermal stress acts which is generated when the high-temperature superconducting coil is cooled to a temperature of a critical temperature of the oxide superconducting wire or lower to be used. In addition, it is possible to provide a high-temperature superconducting coil of which there is not a concern that the oxide superconducting layer may be peeled, the superconducting characteristics are not easily deteriorated, and the strength of the coil is high even if the thermal stress repeatedly acts by the repetition of the energization on the high-temperature superconducting coil.

If the high-temperature superconducting coil is configured by using an oxide superconducting wire including an intermediate layer, an oxide superconducting layer, and an metal stabilized layer on the tape-shaped substrate, the stress acts on the superconducting coil in the direction in which the oxide superconducting layer is peeled off from the substrate due to the load of the thermal stress on the high-temperature superconducting coil. However, by the high-temperature superconducting coil according to the first aspect of the invention, since the impregnated resin layer is formed of an impregnated resin of which the thermal shrinkage rate at 140 K with respect to 293 K is greater than or equal to −0.517%, it is possible to provide a high-temperature superconducting coil in which the oxide superconducting layer is less concerned to be peeled and the superconducting characteristics are not easily deteriorated.

In the high-temperature superconducting coil according to the first aspect of the invention, the impregnated resin layer may contain filler particles in a range of 47% by volume to 80% by volume.

If the impregnated resin layer contains the filler particles in a range of 47% by volume to 80% by volume, the thermal shrinkage rate of the impregnated resin layer at 140 K with respect to 293 K can be controlled to be greater than or equal to −0.517% and thus it is possible to provide a high-temperature superconducting coil of which the superconducting characteristics are not easily deteriorated even if the thermal stress acts.

In the high-temperature superconducting coil according to the first aspect of the invention, a particle diameter of the filler particles may be less than or equal to 12 µm.

If a particle diameter of the filler particles is caused to be less than or equal to 12 µm, the filler particles in the impregnated resin can be evenly dispersed. In addition, if the coefficient of the viscosity of the impregnated resin is not caused to be unnecessarily high, it is possible to form an impregnated resin layer in which voids are not easily generated, and thus it is possible to provide a strong high-temperature superconducting coil.

In the high-temperature superconducting coil according to the first aspect of the invention, the impregnated resin layer may be formed of a resin having a coefficient of viscosity of less than or equal to 560 mPa·s at 60° C.

If the impregnated resin layer is formed of a resin having a coefficient of viscosity of less than or equal to 560 mPa·s at 60° C., an impregnation treatment in which the impregnating ability is preferable and voids are not easily generated can be performed, and thus it is possible to provide a strong high-temperature superconducting coil.

A superconducting device according to a second aspect of the invention includes the high-temperature superconducting coil according to the first aspect of the invention.

If the superconducting device includes the high-temperature superconducting coil which strongly resists the application of the thermal stress, it is possible to provide a superconducting device of which the superconducting characteristics are not deteriorated and the excellent superconducting characteristic can be maintained even if an operation of cooling the high-temperature superconducting coil to the critical temperature of the oxide superconducting wire or lower is performed.

Effects of the Invention

According to respective aforementioned aspects of the invention, the impregnated resin layer is formed of the impregnating material of which the thermal shrinkage rate at 140 K with respect to 293 K is greater than or equal to −0.517%. Therefore, it is possible to provide a high-temperature superconducting coil of which the oxide superconducting layer is not concerned to be peeled and the superconducting characteristics are not easily deteriorated even if the thermal stress generated when the high-temperature superconducting coil is cooled to less than or equal to a temperature of a critical temperature of the oxide superconducting wire to be used acts. In addition, it is possible to provide a high-temperature superconducting coil in which the oxide superconducting layer is less concerned to be peeled, the superconducting characteristics are not easily deteriorated, and the strength of the coil is high even if the repeated thermal stress has an effect by the repetition of the energization on the high-temperature superconducting coil and a superconducting device using the high-temperature superconducting coil.

DETAILED DESCRIPTION OF THE INVENTION

Hereinafter, a high-temperature superconducting coil according to a first embodiment of the invention is described with reference to the drawings.

Figure 1:
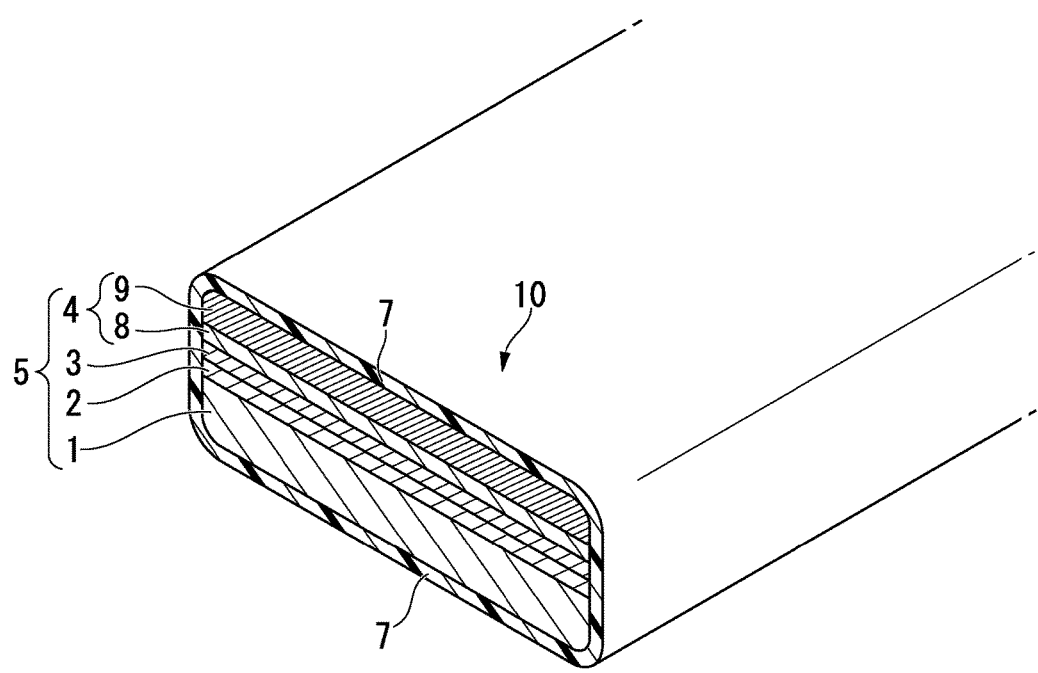
FIG. 1 is a cross-sectional view partially showing a structure of a first embodiment of an oxide superconducting wire used for manufacturing a high-temperature superconducting coil according to the first embodiment of the invention.
Figure 2:
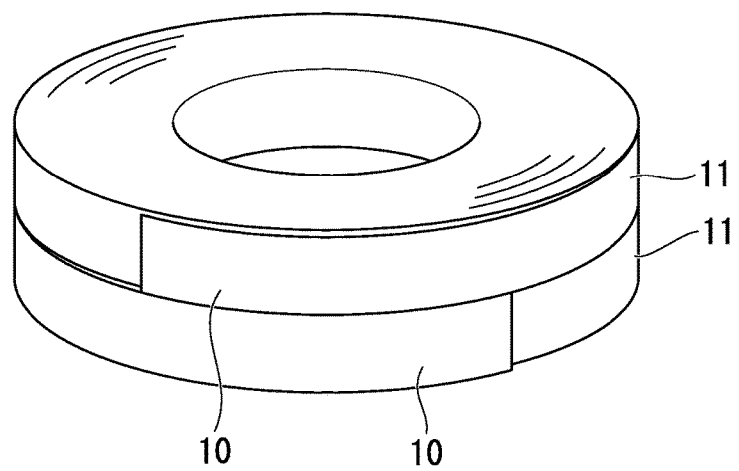
FIG. 2 is a perspective view showing a structure in which two superconducting coils formed of the oxide superconducting wire shown in FIG. 1 are stacked on the upper and lower sides.

FIG. 1 is a cross-sectional view schematically showing an exemplary structure of an oxide superconducting wire for configuring a high-temperature superconducting coil according to the first embodiment of the invention. Coil main bodies 11 shown in FIG. 2 are configured by using an oxide superconducting wire 10 of this example. A superconducting device 20 including a high-temperature superconducting coil 17 shown in FIG. 3 having a structure in which the plurality of coil main bodies 11 are stacked and hardened by an impregnated resin is configured.

The oxide superconducting wire 10 of the embodiment shown in FIG. 1 has a structure in which an insulating coating layer 7 that covers the circumference surface of a superconductor laminate 5 is formed on the circumference surface of the superconductor laminate 5 having a configuration in which an intermediate layer 2, an oxide superconducting layer 3, and a metal stabilized layer 4 are stacked on one surface (first surface) of a substrate 1 in this sequence. The metal stabilized layer 4 according to the embodiment is configured with a first metal stabilized layer 8 formed on the oxide superconducting layer 3 and a second metal stabilized layer 9 formed on the first metal stabilized layer 8.

In addition, for better understanding of the invention and for convenience, with respect to the oxide superconducting wire 10 shown in FIG. 1, thicknesses of the respective layers are shown in exaggerated manner, but the oxide superconducting wire 10 according to the embodiment has a thin tape shape entirely. In addition, in the respective drawings showing embodiments below, for better understanding of the invention, portions that become main portions may be shown in an expanded and exaggerated manner, and dimension ratios or the like of the respective components may not be the same as those in reality.

The substrate 1 is preferably a tape shape to be long, and is formed by high-strength metal material having excellent heat resistance such as nickel alloy represented by hastelloy (Product name manufactured by Haynes International, Inc.). Among them, any one of hastelloy B, C, G, N, and W in which there are different component amounts of molybdenum, chrome, iron, cobalt, or the like can be used as hastelloy. In addition, as the substrate 1, a textured Ni—W alloy tape substrate in which a texture is introduced to the nickel alloy can be applied. The thickness of the substrate 2 may be appropriately adjusted according to a purpose, and can be set to be in a range of 10 μm to 500 μm.

The intermediate layer 2 controls the crystal orientation of the oxide superconducting layer 3 and prevents the diffusion of a metallic element to the oxide superconducting layer 3 side in the substrate 1. Further, the intermediate layer 2 functions as a buffer layer for alleviating the difference between physical characteristics (coefficients of thermal expansion, lattice constants, or the like) of the substrate 1 and the oxide superconducting layer 3, and the material thereof is preferably a metal oxide of which the physical characteristics indicate an intermediate value of the substrate 1 and the oxide superconducting layer 3.

For example, the intermediate layer 2 may have a stacked structure of a diffusion preventing layer, a bed layer, a textured layer, and a cap layer, and may be configured by omitting either or both of the diffusion preventing layer and the bed layer.

The diffusion preventing layer is formed for the purpose of preventing the diffusion of the constituent element in the substrate 1, is configured with silicon nitride ($Si_3N_4$), aluminum oxide ($Al_2O_3$), and GZO ($Gd_2Zr_2O_7$), and is formed by a film forming method such as a sputtering method to have the thickness in a range of 10 nm to 400 nm.

The bed layer is a layer that has high heat resistance and that decreases interface reactivity and can be used for obtaining the orientation of a film that is formed on the bed layer. The bed layer is formed of $Y_2O_3$, $Er_2O_3$, $CeO_2$, $Dy_2O_3$, $Er_2O_3$, $Eu_2O_3$, $Ho_2O_3$, and $La_2O_3$. The bed layer is formed by a film forming method such as a sputtering method, and the thickness is, for example, in a range of 10 nm to 100 nm.

The textured layer is formed of a biaxially textured substance in order to control the crystal orientation of the cap layer arranged on the textured layer. Specifically, metal oxide such as $Gd_2Zr_2O_7$, MgO, $ZrO_2$—$Y_2O_3$(YSZ), $SrTiO_3$, $CeO_2$, $Y2O_3$, $Al_2O_3$, $Gd_2O_3$, $Zr_2O_3$, $Ho_2O_3$, and $Nd_2O_3$ can be exemplified as the material of the textured layer.

If the textured layer is formed to have a preferable biaxial orientation by an ion-beam-assisted deposition (IBAD) method, the crystal orientation of the cap layer can be caused to be preferable, and the crystal orientation of the oxide superconducting layer 7 which is formed on the cap layer is caused to be preferable, and thus an excellent superconducting characteristic can be exhibited.

The cap layer is formed on the surface of the textured layer described above, and is formed of a material that can cause crystals grains to be self-oriented in the in-plane direction, and specifically, the cap layer is formed of $CeO_2$, $Y_2O_3$, $Al_2O_3$, $Gd_2O_3$, $ZrO_2$, YSZ, $Ho_2O_3$, $Nd_2O_3$, and $LaMnO_3$.

Among the materials, the $CeO_2$ layer can be formed at a high film forming speed by a PLD method (pulse laser deposition method) and sputtering so that the preferable crystal orientation can be obtained. The film thickness of the cap layer can be formed to be in a range of 50 nm to 5,000 nm.

As the oxide superconducting layer 3, a well-known high-temperature superconductor may be used. Specifically, an oxide superconducting layer formed of a material of $REBa_2Cu_3Oy$ (RE represents a rare earth element such as Y, La, Nd, Sm, Er, or Gd) can be exemplified. As the oxide superconducting layer 3, Y123 ($YBa_2Cu_3O_{7-x}$), Gd123 ($GdBa_2Cu_3O_{7-x}$), or the like can be exemplified.

The oxide superconducting layer 3 can be stacked by a physical vapor deposition such as a sputtering method, a vacuum deposition method, a laser deposition method, an electron beam deposition method, and a chemical vapor deposition method (CVD method), a metal organic deposition method (MOD method), or the like. Among them, in view of productivity, a pulse laser deposition (PLD) method, an organic metal deposition method and a coating thermal decomposition method using trifluoroacetate (TFA-MOD method), or a CVD method can be used.

The first metal stabilized layer 8 (protecting layer) is formed as a layer that has a preferable conductivity such as Ag or a Ag alloy, of which contact resistance with the oxide superconducting layer 3 is low, and is well fitted to the oxide superconducting layer 3. As a reason for configuring the first metal stabilized layer 8 with Ag, the fact that oxygen is caused to easily penetrate the oxide superconducting layer 3 in the oxygen annealing process for doping oxygen on the oxide superconducting layer 3 is included. A mother substance of the oxide superconducting layer manufactured by the film forming method is an insulator, but becomes an oxide superconducting layer having a crystal structure by incorporating oxygen by an oxygen annealing treatment and exhibits the superconductivity characteristics. In order to form the first metal stabilized layer 8, the film forming method such as the sputtering method is employed, so that the thickness thereof is in a range of 1 μm to 30 μm.

The second metal stabilized layer 9 is preferably formed with a relatively cheap conductive metal material such as copper, a copper alloy such as a Cu—Zn alloy, and a Cu—Ni alloy, aluminum or an alloy thereof, and stainless steel. When the oxide superconducting layer 3 is transit from a superconducting state to a normal conducting state, the second metal stabilized layer 9 functions as a by-pass that commutates the current of the oxide superconducting layer 3 together with the first metal stabilized layer 8. In addition, if the oxide superconducting wire 10 is used as a superconductivity current limiter, the stabilized layer is used for instantly limiting overcurrent generated when quenching occurs and the superconducting state transitions to the normal conducting state. In this case, the material used for the second metal stabilized layer 9 is, for example, high resistance metal such as a Ni alloy such as Ni—Cr is included. The thickness of the second metal stabilized layer 9 is, for example, in a range of 10 μm to 300 μm.

In order to form the second metal stabilized layer 9, the formation can be performed using a stabilized tape obtained by forming a Sn plating soldered layer for connection on the rear surface of tape material formed of the material described above by a method of soldering the second metal stabilized layer 9 on the first metal stabilized layer 8. In addition, the second metal stabilized layer 9 can employ various other configurations, and thus the other structures are described in other embodiments below.

In the oxide superconducting wire 10 configured as described above, the insulating protecting layer 7 is formed by lap-winding an insulating tape such as a polyimide tape or co-winding an insulating tape such as a polyimide tape is so that the whole circumference of the oxide superconducting wire 10 is surrounded thereby to have an insulating structure, and thus the oxide superconducting wire 10 configured as described above is applied for the use of the superconducting device such as the use of the superconducting coil.

Figure 3:
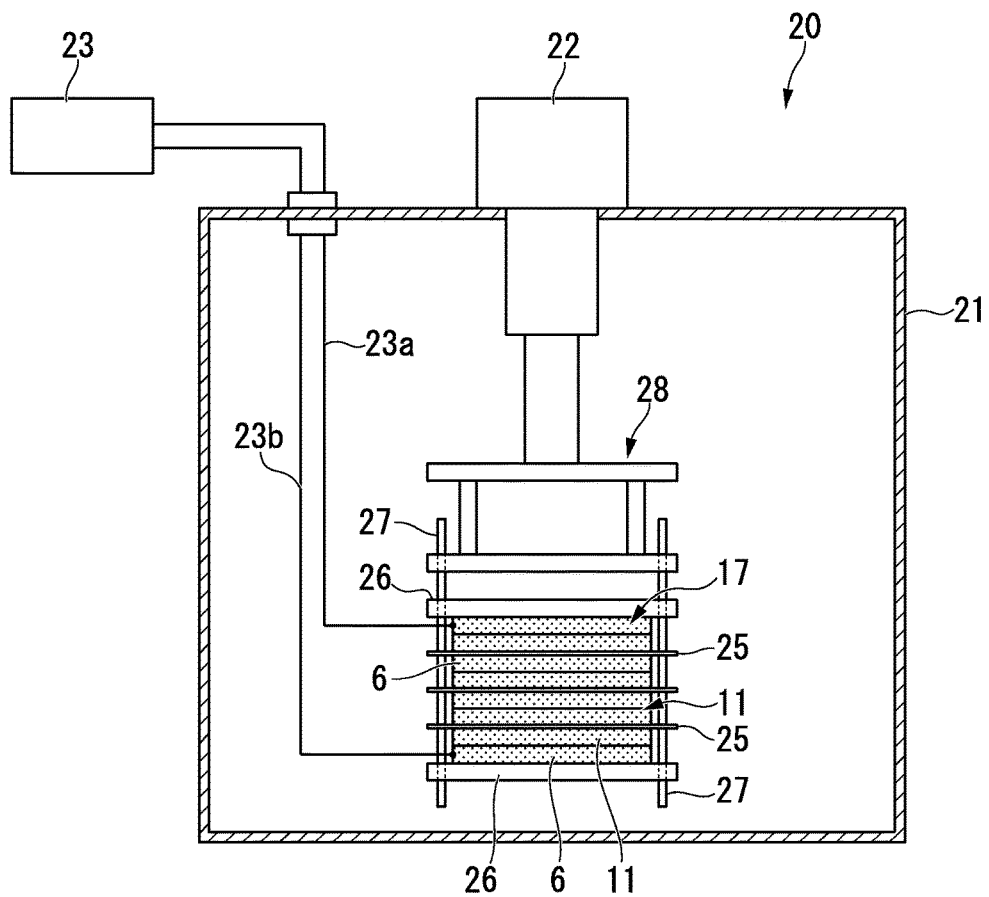
FIG. 3 is a view showing an exemplary configuration of the superconducting device in which the superconducting coils shown in FIG. 2 are stacked and stored in a heat insulation container.

FIG. 2 shows a state in which two coil main bodies 11 obtained by winding the oxide superconducting wire 10 in a concentric circular shape are stacked. As shown in FIG. 3, the high-temperature superconducting coil 17 according to the embodiment is configured by piling a required number of coil main bodies (pancake coils) 11 and inserting the coil main bodies into a bobbin which includes collar plates 26 and 26. The superconducting device 20 is configured to include the high-temperature superconducting coil 17.

In the high-temperature superconducting coil 17 according to the embodiment shown in FIG. 3, eight of the coil main bodies 11 are piled. In every two of the coil main bodies 11 piled, cooling plates 25 manufactured with metal disks are interposed therebetween, and the whole body is disposed between the collar plates 26 and 26. In addition, a winding drum (not shown) is provided between the collar plates 26 and 26, and the eight coil main bodies 11 are stacked along the winding drum.

The high-temperature superconducting coil 17 described above is an example, and thus the high-temperature superconducting coil that can be applied to the embodiment is not limited to the structure shown in FIG. 3. The configuration may be performed so that one of the oxide superconducting wire 10 is wound in a concentric circular shape on the whole body of a winding drum between collar plates. In addition, a stacked number of the coil main bodies 11 may be an arbitrary number.

In the high-temperature superconducting coil 17 according to the embodiment, all of the eight coil main bodies 11 are fixed and integrated by an impregnated resin. One of the eight resin-impregnated coil main bodies 11 is extracted and described below based on FIG. 4.

Figure 4:
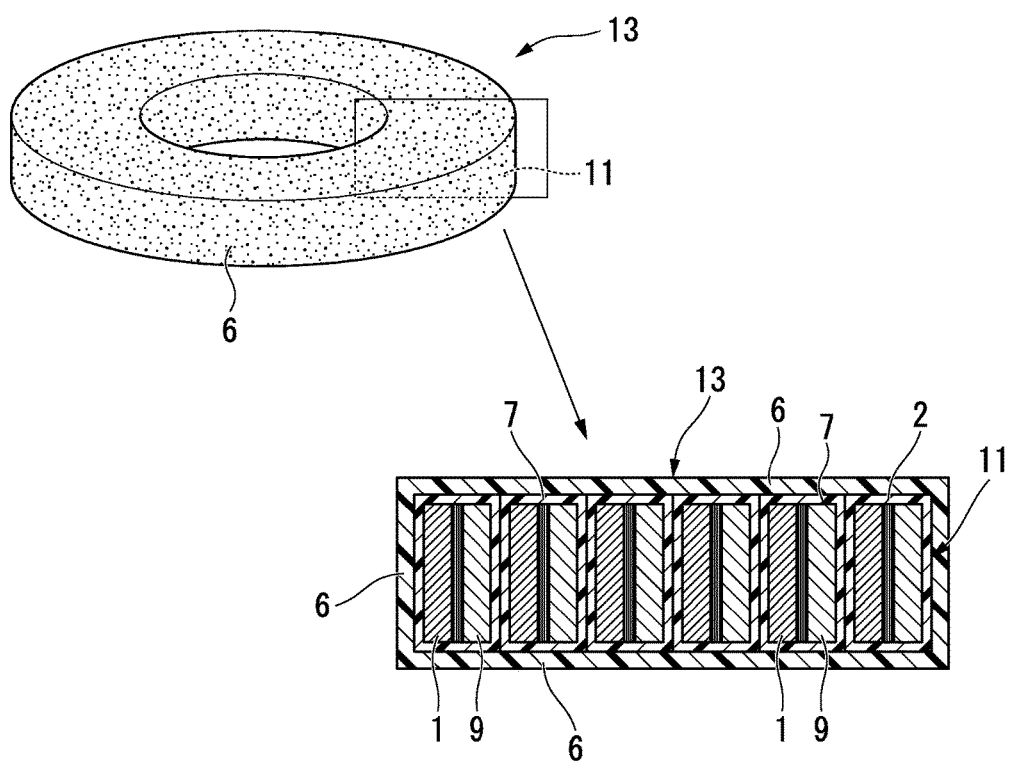
FIG. 4 is an explanatory view showing an example of a high-temperature superconducting coil having a structure being fixed by the resin impregnation and stored in the superconducting device shown in FIG. 3 and a partial enlarged view thereof.

As shown in FIG. 4, the coil main body 11 is configured by winding the oxide superconducting wire 10 in a concentric circular shape, and an impregnated coil 13 is configured by covering the whole body of the coil main body 11 with an impregnated resin layer 6.

Specifically, in the high-temperature superconducting coil 17, eight of the coil main bodies 11 in total are piled with the cooling plates 25 interposed between every two coil main bodies 11, and also eight of the coil main bodies 11 are respectively covered with the impregnated resin layer 6 to be fixed.

Figure 6:
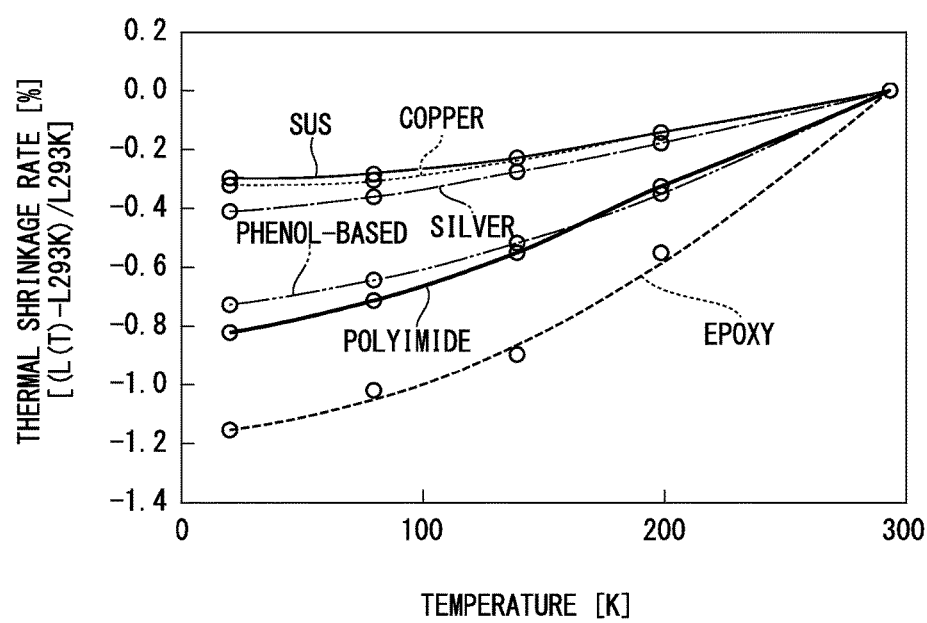
FIG. 6 is a graph showing temperature dependency of thermal shrinkage rates of respective materials such as an epoxy resin, a polyimide resin, a phenol resin, silver, and copper.

With reference to FIG. 6 in which a thermal shrinkage rate of an epoxy resin, polyimide, a phenol resin, silver, copper, and the like is relatively displayed, since the thermal shrinkage rate of the resin materials and the metal materials used in the superconducting wire and the superconducting coil are substantially linearly changed, even if the thermal shrinkage rate at 140 K with respect to 293 K is used, the heat shrinkage behavior in the superconducting coil operation temperature range can be understood.

Here, the relationship between the thermal shrinkage rate at 140 K with respect to 293 K and the superconducting coil characteristic was examined.

In the oxide superconducting wire 10, it was found from the test results of examples described below, that if the thermal shrinkage rate was set to be −0.517% or greater, the peeling of the oxide superconducting wire was able to be prevented and a superconducting coil in which the superconducting characteristic was not deteriorated was able to be obtained. If the thermal shrinkage rate is controlled, the peeling of the oxide superconducting wire 10 is prevented and a superconducting coil 17 in which the superconducting characteristics are not deteriorated can be obtained.

In order to cause the thermal shrinkage rate to be −0.517% or greater, filler particles are preferably added in a range of 47% by volume to 80% by volume. The impregnated resin layer 6 is formed by using a thermosetting resin such as an epoxy resin, a phenol resin, a urea resin, and a melamine resin and dispersing the filler particles in the ratio described above. As the filler particles (inorganic particles), particles formed of any one kind or two or more kinds of BN, AlN, ZnO, $Al_2O_3$ (alumina), glass, $SiO_2$ (silica), $ZrO_2$, and MgO can be applied.

In order to cause the thermal shrinkage rate of the impregnated resin layer 6 to be in the objective range, it may be effective to cause the impregnated resin layer 6 to contain the filler particles. From the various test results by the inventors of the invention explained later, it was concluded that the filler particles are preferably contained by 47% by volume or greater, for example, in a range of 47% by volume to 80% by volume, and more preferably in a range of 55% by volume to 80% by volume. In addition, if the impregnated resin layer 6 contains the filler particles in a range described above, the thermal shrinkage rate at 140 K with respect to 293 K can be caused to be −0.517% or greater. If the thermal shrinkage rate is controlled to be in a range described above, the peeling strength in the oxide superconducting wire 10 that configures the high-temperature superconducting coil 17 can be decreased, and the deterioration of the superconducting characteristic (critical current value: Ic) of the high-temperature superconducting coil 17 can be prevented.

In addition, the particle diameter of the filler particles dispersed in the impregnated resin layer 6 is preferably less than or equal to 12 μm. If the particle diameter of the filler particles is smaller, it is preferable in that the dispersibility and the impregnating ability become more preferable and thus the required thermal shrinkage rate can be maintained. In the impregnated resin that configures the impregnated resin layer 6, a coefficient of viscosity at 60° C. before being cured is preferably less than or equal to 560 mPa·s, and the thermal shrinkage rate at 140 K with respect to 293 K of the impregnated resin layer 6 is preferably greater than or equal to −0.517%.

If the particle diameter of the filler particles dispersed in the impregnated resin layer 6 is great, the dispersibility of the filler particles decreases, such that the distribution of shrinkage rates of the coil after impregnation increases.

If the particle diameter of the filler particles is smaller, the dispersibility becomes preferable and thus the distribution of shrinkage rates of the coil after impregnation decreases. If the filler particles are fine particles of which the particle diameter is less than 1 μm, the coefficient of viscosity increases and the agglomeration of the fine particles is generated at the time of the heating for curing the resin layer 6 and thus there is no reason to reduce the particle diameter. Therefore, the particle diameter of the filler particles is more preferably in a range of 1 μm to 12 μm.

In addition, if the coefficient of viscosity of the resin that configures the impregnated resin layer 6 is excessively great before curing, the resin may not be impregnated to every corner of the coil main bodies 11 when impregnation is performed. Therefore, voids may be introduced to the inside portion of the high-temperature superconducting coil 17, and thus there is a concern that the strength of the high-temperature superconducting coil 17 is decreased.

Subsequently, the superconducting device 20 shown in FIG. 3 including the high-temperature superconducting coil 17 that is configured as described above is described.

The superconducting device 20 shown in FIG. 3 is an example of a superconducting magnet device including a storing container 21 such as a cryostat, the high-temperature superconducting coil 17 that is installed inside the storing container, and a cryocooler 22 for cooling the high-temperature superconducting coil 17 inside the storing container 21 to a critical temperature or lower. The storing container 21 is connected to a vacuum pump (not shown) and is configured so that the inside thereof can be depressurized to an objective degree of vacuum. In addition, the high-temperature superconducting coil 17 is connected to a power supply 23 on the outside of the storing container 21 via current lead lines 23a and 23b, so that electricity can flow from the power supply 23 to the high-temperature superconducting coil 17.

In the superconducting device 20 shown in FIG. 3, if the cryocooler 22 is operated, the cryocooler 22 performs conduction cooling on the collar plates 26 and 26 and the plurality of cooling plates 25 via a heat transfer member 28 and a cooling rod 27, and thus the high-temperature superconducting coil 17 can be cooled to the critical temperature or lower (for example, the temperature of 77 K or lower, 50 K, or 20 K).

In the superconducting device 20 shown in FIG. 3, if the high-temperature superconducting coil 17 starts to be cooled by the cryocooler from room temperature to the critical temperature or lower to be used, the impregnated resin layer 6 that covers the high-temperature superconducting coil 17 is thermally shrunk such that stress may affect the high-temperature superconducting coil 17. However, since the oxide superconducting wire 10 is covered with the impregnated resin layer 6 having a thermal shrinkage rate of greater than or equal to −0.517% in which filler particles are dispersed, the stress that affects the high-temperature superconducting coil 17 caused by the thermal shrinkage can be alleviated. Therefore, the stress that has an effect in accordance with the thermal shrinkage of the oxide superconducting wire 10 that configures the high-temperature superconducting coil 17 can be decreased.

Accordingly, even if the thermal stress is caused to act by performing a cooling operation from room temperature to the critical temperature or lower, the stress that acts on the oxide superconducting wire 10 can be decreased. Therefore, the superconducting device 20 can be used without deteriorating the superconducting characteristics of the oxide superconducting wire 10.

The structure of the oxide superconducting wire 10 applied to the first embodiment above is not limited to the structure shown in FIG. 1, and another structure may be employed. For example, the oxide superconducting wire may be substituted for the oxide superconducting wire in the structure shown below based on FIG. 5 as shown below.

Figure 5:
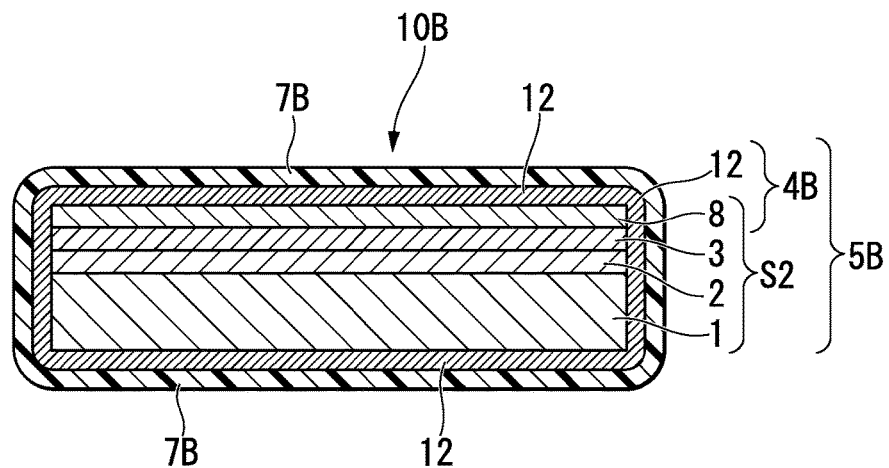
FIG. 5 is a sectional view partially showing a structure of a second embodiment of the oxide superconducting wire used for manufacturing the high-temperature superconducting coil according to the first embodiment of the invention.

FIG. 5 is a cross-sectional view schematically showing an oxide superconducting wire according to a second embodiment that can be applied to the high-temperature superconducting coil according to the first embodiment of the invention.

An oxide superconducting wire 10B shown in FIG. 5 includes a stacked base body S2 with a rectangular cross section formed by stacking the intermediate layer 2, the oxide superconducting layer 3, the first metal stabilized layer 8, in this sequence, on one surface (first surface) of the substrate 1, in the center. The oxide superconducting wire 10B has a structure in which, on the circumference surface of a superconductor laminate 5B with a rectangular cross section that is formed so that the circumference surface of the stacked base body S2 is covered with a second metal stabilized layer 12, an insulating coating layer 7B that covers the circumference surface of the superconductor laminate 5B is formed. The metal stabilized layer 4B according to the embodiment is configured with the first metal stabilized layer 8 that is formed on the oxide superconducting layer 3, and the second metal stabilized layer 12 that covers the circumference surface of the stacked base body S2.

With respect to the superconducting wire 10B shown in FIG. 5, components which are the same as those in the oxide superconducting wire 10 shown in FIG. 1 are denoted by the same reference numerals, and detailed descriptions thereof are omitted.

The second metal stabilized layer 12 can be realized by a structure in which a metal tape is subjected to deformation processing and is provided so that the circumferential surface of the stacked base body S2 is covered, or a structure in which a plating layer such as Cu or a Cu alloy is provided so that the circumferential surface of the stacked base body S2 is covered.

In addition, though not shown in FIG. 5, if the second metal stabilized layer 12 formed of a metal tape is integrated via soldering on the outer circumference of the stacked base body S2, a soldered layer exists between the stacked base body S2 and the second metal stabilized layer 12.

A high-temperature superconducting coil according to the first embodiment of the invention can be configured by using the oxide superconducting wire 10B having the structure shown in FIG. 5.

Example

Hereinafter, test results of the high-temperature superconducting coil configured by using the oxide superconducting wire are described, but the invention is not limited to examples described below.

A plurality of tape-shaped substrates which are formed of hastelloy C-276 (product name: manufactured by Haynes International, Inc.), have a width of 5 mm, and have a thickness of 75 μm or 100 μm were prepared.

Subsequently, according to the formation conditions below, on one surface of each of the plurality of substrates, a diffusion preventing layer, a bed layer, a textured layer, and a cap layer were stacked in this sequence. When the respective films were formed, a transporting reel that conveyed the tape-shaped substrate to the inside of a film forming apparatus and a winding reel were provided inside the film forming apparatus and the substrate was moved at a predetermined speed and films were sequentially formed on the substrate.

A diffusion preventing layer which was formed of $Al_2O_3$ and had the film thickness of 100 nm was formed on the tape-shaped substrate by an ion beam sputtering method. Subsequently, a bed layer which was formed of $Y_2O_3$ and had the film thickness of 20 nm was formed on the diffusion preventing layer by an ion beam sputtering method. Subsequently, a textured layer that was formed of MgO and had the film thickness of 10 nm was formed on the bed layer by the IBAD method.

After the textured layer was formed, a cap layer that was formed of $CeO_2$ and had the film thickness of 400 nm was formed by the PLD method, an oxide superconducting layer that had a composition formed of $YBa_2Cu_3O_{7-x}$ and had the thickness of 1 μm was formed, and further, a first metal stabilized layer that had the thickness of 2 μm and was formed of Ag was formed by the sputtering method, so that the plurality of stacked bodies were obtained. These stacked bodies were subjected to the oxygen annealing treatment in the oxygen atmosphere for 10 hours at 500° C.

Metal stabilized tapes that had the thickness of 75 μm or 100 μm and were manufactured by copper as presented in Table 1 were stacked and joined respectively to the plurality of obtained stacked bodies via Sn plating soldered layers, the oxide superconducting wire was obtained.

Hereinafter, PI(L) described in the section of the insulation of Table 1 below is a sample subjected to an insulation treatment by co-winding a polyimide tape on oxide superconducting wire (12.5 μm×1), and PI(S) is a sample subjected to an insulation treatment by lap-winding the polyimide tape with an oxide superconducting wire in a spiral shape (12.5 μm×1).

The coil main bodies having the coil internal diameter and the coil external diameter presented in Table 1 were configured by winding the oxide superconducting wire around the cylindrical winding drum manufactured by glass-fiber reinforced plastic (GFRP) that had the external diameter of 50 mm or 60 mm and the thickness of 5 mm. High-temperature superconducting coils were obtained by vacuum-impregnating the epoxy resins to the coil main bodies. With respect to the high-temperature superconducting coils, the coil characteristics were estimated by measuring electric current (I)-voltage (V) characteristics before and after the resins were impregnated. The results above are presented in Table 1 below. In addition, the temperature of the vacuum impregnation is not particularly limited, the pressure may be applied at the time of the vacuum impregnation, and the vacuum impregnation may be performed by using ultrasonic waves. In Example 6 and Comparative Example 4, the high-temperature superconducting coils were obtained by coating winding (performing winding while impregnating material was coated), not by vacuum impregnation.

TABLE 1

| Sample Number | Wire | Coil Internal Diameter (mm) | Coil External Diameter (mm) | Insulation | Impregnating Material | Ic (A) before Impregnation | n Value before Impregnation | Ic (A) after Impregnation | n Value after Impregnation | Ic (A) after Heat Cycle | n Value after Heat Cycle | Evaluation |
|---|---|---|---|---|---|---|---|---|---|---|---|---|
| Example 1 | 100/100 | 60 | 85 | PI(L) | Trial Impregnating Material III | 84 | 15 | 84 | 15 | 84 | 15 | ○ |

TABLE 1-continued

| Sample Number | Wire | Coil Internal Diameter (mm) | Coil External Diameter (mm) | Insulation | Impregnating Material | Ic (A) before Impregnation | n Value before Impregnation | Ic (A) after Impregnation | n Value after Impregnation | Ic (A) after Heat Cycle | n Value after Heat Cycle | Evaluation |
|---|---|---|---|---|---|---|---|---|---|---|---|---|
| Example 2 | 75/75 | 60 | 85 | PI(L) | Trial Impregnating Material I | 93.5 | 20 | 93 | 21 | 93 | 21 | ◯ |
| Example 3 | 75/75 | 50 | 98 | PI(L) | Trial Impregnating Material IV | 69 | 27 | 69 | 27 | 69 | 26 | ◯ |
| Example 4 | 75/75 | 50 | 116 | PI(S) | Trial Impregnating Material IV | 72 | 29 | 71 | 32 | 71 | 30 | ◯ |
| Example 5 | 100/100 | 60 | 90 | PI(S) | Trial Impregnating Material III | 87 | 18 | 87 | 18 | 87 | 17 | ◯ |
| Example 6 | 75/75 | 60 | 88 | PI(L) | Trial Impregnating Material V | 88 | 30 | 88 | 30 | 89 | 31 | ◯ |
| Comparative Example 1 | 100/100 | 60 | 85 | PI(L) | Existing Impregnating Material I | 92 | 18 | 67 | 6 | — | — | X |
| Comparative Example 2 | 75/75 | 60 | 85 | PI(S) | Existing Impregnating Material I | 97 | 24 | 80 | 6 | — | — | X |
| Comparative Example 3 | 75/75 | 60 | 85 | PI(L) | Trial Impregnating Material II | 95 | 18 | 95 | 18 | 64 | 3 | X |
| Comparative Example 4 | 100/100 | 60 | 77 | PI(S) | Existing Impregnating Material II | 103 | 25 | 97 | 15 | — | — | X |

The descriptions in the section of the wire in Table 1 are thicknesses of the substrates manufactured by hastelloy (μm) and thicknesses of the metal stabilized materials manufactured by copper, 100/100 means 100 μm of a substrate manufactured by hastelloy +100 μm of stabilized copper, and 75/75 means 75 μm of a substrate manufactured by hastelloy +75 μm of stabilized copper.

The sample of Existing Impregnating Material I described in the section of the impregnating material means that an impregnated resin manufactured by an epoxy resin (−0.827% in thermal shrinkage rate: thermal shrinkage rate at 140 K with respect to 293 K) which is obtainable in the related art and of which the linear expansion is 60 ppm is used.

The determinations of Table 1 were measured with critical current values Ic (A) (based on $10^{-6}$ V/cm) and n values (in a range of $10^{-8}$ V/cm to $10^{-6}$ V/cm) by measuring the coils before and after the resin impregnation in liquid nitrogen. The n value refers to a multiplier when an approximate curve of I-V characteristics are presented by a power multiplier, and is an index that enables to determinate that, if the n value is changed, a voltage is locally generated from a wire inside a coil (oxide superconducting wire is deteriorated).

The heat cycle test of Table 1 is a result obtained when an operation of once raising a temperature to room temperature after resin impregnation evaluation and again measuring Ic of a coil in liquid nitrogen was repeated three times. If the distortion of the oxide superconducting wire and the coil impregnating material is great, the oxide superconducting wire is deteriorated by being subjected to a repeated heat cycle and thus it is considered that this evaluation is important.

The symbol O described in the section of the evaluation in Table 1 represents that Ic after impregnation or after heat cycle was not decreased by 5 A or more compared with Ic before the resin impregnation, or that an n value after the resin impregnation or an n value after the heat cycle was not decreased by 10 or more compared with an n value before the resin impregnation. The symbol X described in the section of the evaluation in Table 1 represents that Ic after impregnation or after heat cycle was decreased by 5 A or more compared with Ic before the resin impregnation, or that an n value after the resin impregnation or an n value after the heat cycle was decreased by 10 or more compared with an n value before the resin impregnation.

The characteristics of impregnating materials (impregnated resins or resins) used in respective samples in Table 1 are collectively presented in Table 2 below.

TABLE 2

| Types | Filler Particle Diameter (μm) | Coefficient of Viscosity (60° C.) (mPa · s) | Shrinkage rate (293 K to 140 K) (%) | Tensile Strength (MPa) |
|---|---|---|---|---|
| Existing Impregnating Material I | None | 70 | −0.827 | 51.4, 61.0 |
| Existing Impregnating Material II | — | 15000 | −0.6 | — |
| Trial Impregnating Material I | 5 | 560 | −0.338 | 56.4, 58.3 |
| Trial Impregnating Material II | 13 | 1500 | −0.355 | 20.7, 35.3 |
| Trial Impregnating Material III | 12 | 140 | −0.517 | 40.7, 43.7 |
| Trial Impregnating Material IV | 2.6 | 560 | −0.34 | 64.4, 66.1 |
| Trial Impregnating Material V | — | 45000 | −0.24 | — |

The shrinkage rate in Table 2 means [L(140 K) − L(293 K)]/L(293 K) × 100 [%] (293 K = 20° C.) (rate of change of length when cooling was performed from 293 K to 140 K).

In the tests presented in Table 1, results obtained by measuring diameters of filler particles used when the impregnating materials were manufactured, coefficients of viscosity of impregnated resins, and shrinkage rates and tensile strengths of respective impregnating materials are represented by using seven impregnating materials of Existing Impregnating Materials I and II, and Trial Impregnating Materials I, II, III, IV, and V presented in Table 2. In addition, the amount of the filler particles (silica) of Trial Impregnating Material I is 55% by volume, the amount of the filler particles (silica) of Trial Impregnating Material II is 55% by volume, the amount of the filler particles (alumina) of Trial Impregnating Material III is 47% by volume, the amount of the filler particles (silica) of Trial Impregnating Material IV is 55% by volume.

From the results presented in Tables 1 and 2, if impregnating materials of which the thermal shrinkage rate at 140 K with respect to 293 K was greater than or equal to −0.517% was used, it was found that the impregnating materials were able to endure the heat cycle test. That is, as presented in Table 2, Trial Impregnating Materials I, III, and IV show characteristics of having the filler particle diameters in a range of 2.6 µm to 12 µm (12 µm or lower), coefficients of viscosity in a range of 140 mPa·s to 560 mPa·s (560 mPa·s or lower), and the shrinkage rate of greater than or equal to −0.517%. In the samples of Examples 1 to 5 in which Trial Impregnating Materials I, III, and IV were used, the n values of the impregnation were not decreased and the decrease in the Ic values after the impregnation was not generated.

According to this, in the case of vacuum impregnation, in order to cause the impregnating ability to be preferable, it was found that the coefficient of viscosity of the impregnating materials which was less than or equal to 560 mPa·s (60° C.) was required. In addition, it was found that the particle diameter of the inorganic particles that are combined with the impregnating materials was preferably less than or equal to 12 µm. In addition, from the results of Example 6 presented in Tables 1 and 2, it was found that when the superconducting coil was obtained by coating winding, not by vacuum impregnation, even if the coefficient of viscosity is greater than 560 mPa·s, if an impregnating material of which the thermal shrinkage rate at 140 K with respect to 293 K is greater than or equal to −0.517% was used, the impregnating material was able to endure the heat cycle test.

In contrast, the impregnating materials of Comparative Examples 1 and 2 were epoxy resin impregnating materials which do not contain the filler as presented in Table 2, and since the shrinkage rate thereof was great, the decrease of the n value after impregnation was remarkable, and a decrease of the Ic value after impregnation was generated.

Since Trial Impregnating Material II presented in Table 2 has a high coefficient of viscosity, it is considered that voids were generated in the impregnated resin layer and the tensile strength of the impregnating material was decreased. Therefore, it is considered that, in Comparative Example 3, since the coefficient of viscosity was high, the impregnating ability was bad and the coil characteristic was deteriorated. It is considered that the high coefficient of viscosity of the impregnating material was because the particle diameter of the filler was greater than 12 µm and was 13 µm. In addition, if the filler having the particle diameter of 5 µm is contained in an amount of more than 80% by volume, the coefficient of viscosity becomes greater than 1,000 mPa·s, and thus there is a large concern that voids are generated. Therefore, the amount of the filler is preferably less than or equal to 80% by volume.

Existing Impregnating Material II of Comparative Example 4 was an epoxy resin impregnating material (amount of filler particles is 40% by volume) having the thermal shrinkage rate of −0.6% (thermal shrinkage rate at 140 K with respect to 293 K), but the decrease of the n value after impregnation was generated and the decrease of the Ic value after impregnation was generated.

In addition, a polyimide tape is used for the insulation in the examples, but the insulation is not limited as long as the insulation is a resin material that can be manufactured in the same condition, and polyester, glass tape, or the like can be also applied. In addition, the method of performing the insulation is not limited to the lap winding, and the co-winding, and the number of layers is not limited. The sectional structure of the used oxide superconducting wire is not limited to the structure of FIG. 1, and the oxide superconducting wire having the structure shown in any one of FIG. 5 and the like may be used.

DESCRIPTION OF REFERENCE NUMERAL

1 . . . SUBSTRATE, 2 . . . INTERMEDIATE LAYER, 3 . . . OXIDE SUPERCONDUCTING LAYER, 4 . . . METAL STABILIZED LAYER, 5 . . . SUPERCONDUCTOR LAMINATE, 6 . . . IMPREGNATED RESIN LAYER, 7 . . . INSULATING COATING LAYER, 8 . . . FIRST METAL STABILIZED LAYER, 9 . . . SECOND METAL STABILIZED LAYER, 10 . . . OXIDE SUPERCONDUCTING WIRE, 10B . . . OXIDE SUPERCONDUCTING WIRE, 11 . . . COIL MAIN BODY, 12 . . . SECOND METAL STABILIZED LAYER, 13 . . . IMPREGNATED COIL, 17 . . . HIGH-TEMPERATURE SUPERCONDUCTING COIL, 20 . . . SUPERCONDUCTING DEVICE, 21 . . . CRYOSTAT, 22 . . . CRYOCOOLER, 23 . . . POWER SUPPLY, 25 . . . COOLING PLATE, 26 . . . COLLAR PLATE.

What is claimed is:

1. A high-temperature superconducting coil comprising:
an oxide superconducting wire material comprising:
　a tape-shaped substrate,
　an intermediate layer being stacked on the substrate,
　an oxide superconducting layer being stacked on the intermediate layer, and
　a metal stabilized layer being stacked on the oxide superconducting layer;
a coil main body being formed by winding the oxide superconducting wire material in a coil shape; and
an impregnated resin layer being formed of an impregnated resin of which a thermal shrinkage rate (R) indicating a rate of change of a length (L) when cooling is performed from 293 K to 140 K is greater than or equal to −0.517%, the impregnated resin layer covering the coil main body,
wherein filler particles are contained in the impregnated resin layer in a range of 47% by volume to 80% by volume,
a particle diameter of the filler particles is from 2.6 to 12 µm, and
the thermal rate (R) is determined from the following expression (I):

$$R = [L(140K) - L(293K)]/L(293K) \cdot 100(\%) \qquad (I).$$

2. The high-temperature superconducting coil according to claim 1, wherein
a particle diameter of the filler particles is less than or equal to 12 µm.

3. The high-temperature superconducting coil according to claim 1, wherein
the impregnated resin layer is formed of a resin having a coefficient of viscosity of less than or equal to 560 mPas at 60° C.

4. A superconducting device comprising:
the high-temperature superconducting coil according to claim 1.

* * * * *